United States Patent

Kim et al.

[11] Patent Number: 6,057,904
[45] Date of Patent: May 2, 2000

[54] INSULATING LAYER ARRANGEMENTS FOR LIQUID CRYSTAL DISPLAY AND FABRICATING METHOD THEREOF

[75] Inventors: Jeong-Hyun Kim, Kyongki-do; Jae-Kyun Lee, Pusan-shi, both of Rep. of Korea

[73] Assignee: LG Electronics, Inc., Seoul, Rep. of Korea

[21] Appl. No.: 08/953,631

[22] Filed: Oct. 17, 1997

[30] Foreign Application Priority Data

Oct. 29, 1996 [KR] Rep. of Korea .................. 96-49400

[51] Int. Cl.[7] ........................ G02F 1/1343; H01L 29/04
[52] U.S. Cl. ........................... 349/143; 257/59; 257/72
[58] Field of Search .................... 349/47, 54, 38, 349/40, 143; 257/59, 72

[56] References Cited

U.S. PATENT DOCUMENTS

| | | | |
|---|---|---|---|
| 5,520,563 | 5/1996 | Wallace et al. | 445/24 |
| 5,796,449 | 8/1998 | Song | 349/54 |
| 5,828,430 | 10/1998 | Nishida | 349/44 |
| 5,831,692 | 11/1998 | Lee | 349/38 |
| 5,835,168 | 11/1998 | Takeda et al. | 349/38 |
| 5,835,169 | 11/1998 | Kwon et al. | 349/38 |
| 5,838,037 | 11/1998 | Masutani et al. | 257/296 |
| 5,841,490 | 11/1998 | Matsuo | 349/40 |
| 5,844,255 | 12/1998 | Suzuki et al. | 257/59 |
| 5,844,641 | 12/1998 | Jun et al. | 349/38 |

FOREIGN PATENT DOCUMENTS

0062618  3/1989  Japan ...................... 359/59

*Primary Examiner*—William L. Sikes
*Assistant Examiner*—Heidi L. Eisenhut
*Attorney, Agent, or Firm*—Birch, Stewart, Kolasch & Birch, LLP

[57] ABSTRACT

A liquid crystal display that comprises an insulating substrate, an insulating layer covering the insulating layer, a pixel electrode formed on the insulating layer, an insulating interlayer covering the pixel electrode, the insulating interlayer having a contact hole the contact hole exposing a part of the surface on the pixel electrode, a drain electrode formed on the insulating interlayer, the drain electrode connecting to the pixel electrode through the contact hole, a thin film transistor including the drain electrode, a source electrode and an active layer on the insulating interlayer, and a data line extending to the source electrode and partially overlapping the pixel electrode.

11 Claims, 9 Drawing Sheets

FIG. 6E

INSULATING LAYER ARRANGEMENTS FOR LIQUID CRYSTAL DISPLAY AND FABRICATING METHOD THEREOF

FIELD OF THE INVENTION

The present invention relates to a liquid crystal display and its fabricating method and, more particularly, to a liquid crystal display and its fabricating method having a high aperture ratio by partially overlapping the data line and pixel electrode.

BACKGROUND OF THE INVENTION

An aperture ratio is given by the ratio of the area for light transmission of a pixel to the total area of the pixel. The quality of an image is enhanced in proportion to increase in the aperture ratio. Accordingly, one can enlarge the proportion of the area of the pixel electrode to the total pixel area to increase the aperture ratio.

Figure 1A:
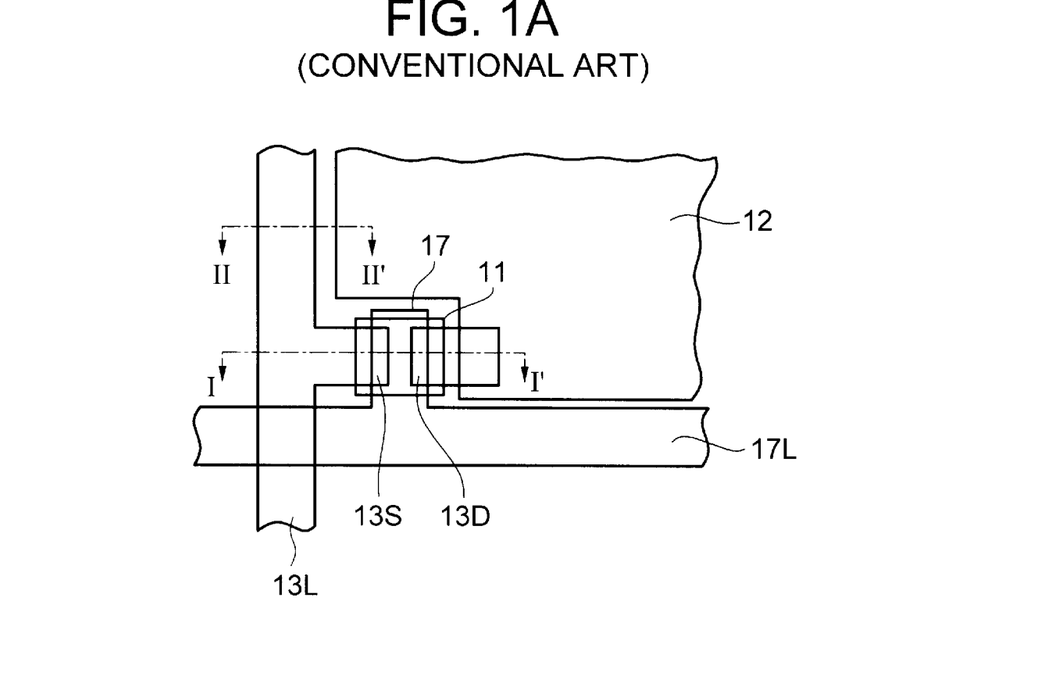
FIGS. 1A, 1B and 1C are plan and sectional views of a conventional liquid crystal display having a top gate structure according to the conventional art.
Figure 1B:
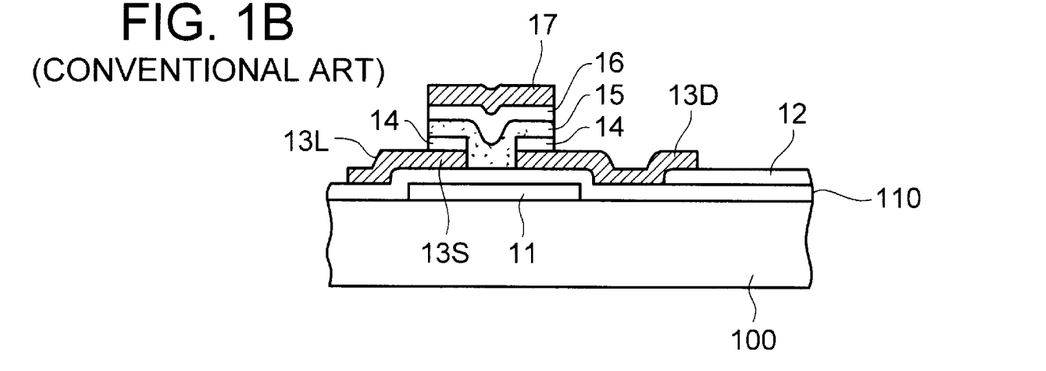
Figure 1C:
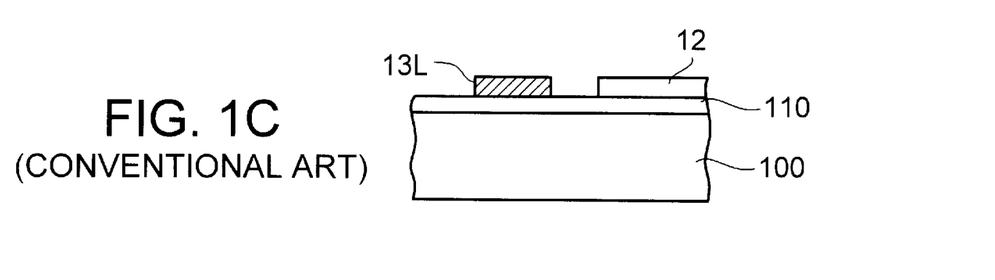

FIGS. 1A, 1B and 1C show a liquid crystal display having a top gate structure according to a conventional art. FIG. 1A is a top view of the conventional liquid crystal display, and FIGS. 1B and 1C are cross-sectional views respectively taken along the lines I-I' and II-II' in FIG. 1A.

Referring to FIG. 1A, a data line 13L intersects a gate line 17L on an insulating substrate. The data line 13L extends to a source electrode 13S. The source electrode 13S is on the opposite side of a drain electrode 13D formed from the same material as the data line 13L. The gate line 17L connects to a gate electrode 17 lying over and overlapping the source and drain electrodes 13S and 13D and an active layer 15, thereby forming a switching device. The drain electrode 13D is connected to a pixel electrode 12.

As shown in FIG. 1B, a light shielding layer 11 is formed on the insulating substrate 100 and an insulating layer 110 covers the whole surface. On the insulating layer 110, the source electrode extended from the data line 13L and the drain electrode 13D being opposite side of the source electrode 13S is formed. The pixel electrode 12 is in contact with the drain electrode 13D and positioned on the same layer with the data line 13L. On the source and drain electrodes 13S and 13D, the active layer 15, gate insulating layer 16 and gate electrode 17 are formed in the same pattern. A reference numeral 14 indicates an ohmic contact layer formed of a doped semiconductor.

Referring to FIG. 1C, the insulating layer 110 is formed on the insulating substrate 100, and the data line 13L and the pixel electrode 12 are formed thereon. The data line 13L and the pixel electrode 12 are spaced from each other at a designated distance on the same layer.

FIGS. 2A to 2D are sectional views taken along the lines AA' and BB' in FIG. 1A, illustrating a process for fabricating the conventional liquid crystal display.

Figure 2A:
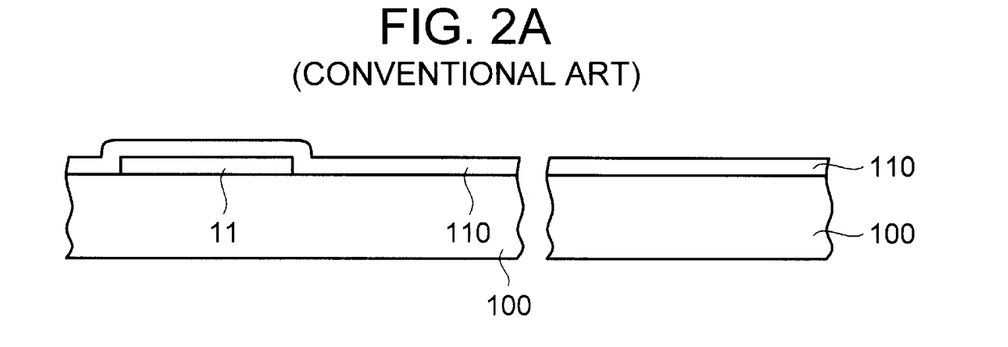
FIGS. 2A to 2D are sectional views taken along the lines I-I' and II-II' in FIG. 1A to illustrate a process for fabricating the conventional liquid crystal display.

As shown in FIG. 2A, a metal layer consisting of Cr or the like is formed on the insulating substrate 100 and etched by photolithography to pattern a light shielding layer 11. An insulating layer 110 is formed by depositing an insulating material such as silicon oxide or silicon nitride.

Figure 2B:
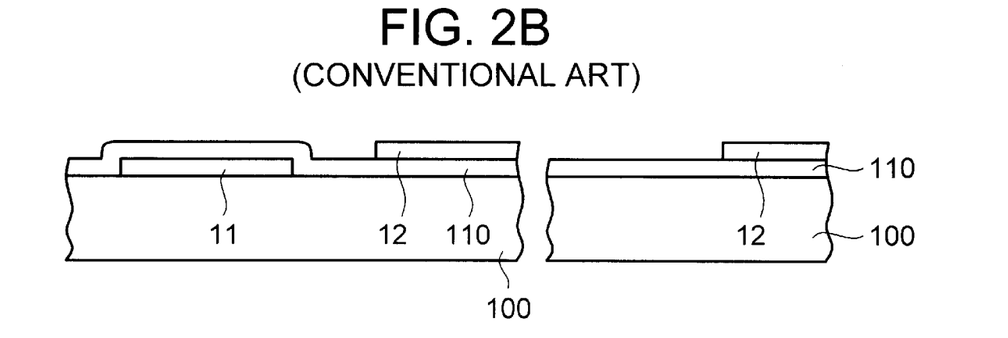

As shown in FIG. 2B, a transparent conductive layer is formed on the insulating layer 100 and etched by photolithography to pattern the pixel electrode 12.

Figure 2C:
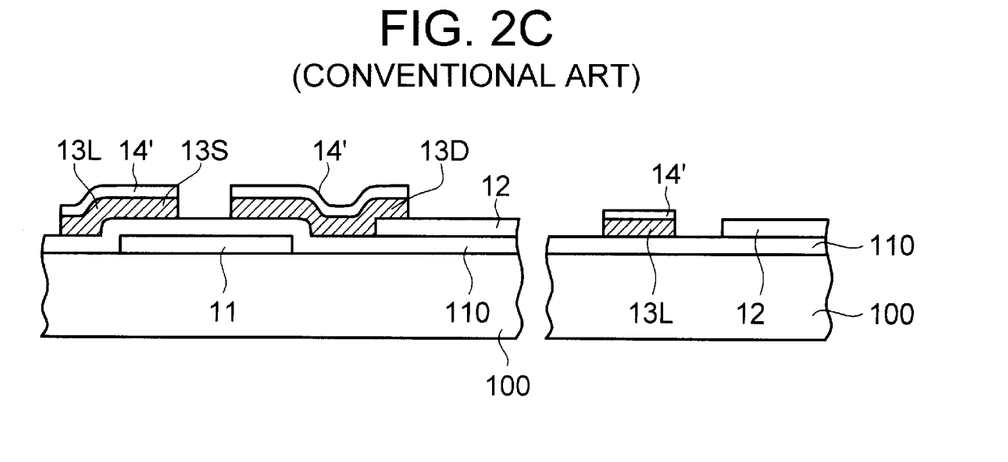

Referring to FIG. 2C, a metal layer consisting of Al or the like and a doped amorphous silicon layer (i.e., the ohmic contact layer) are sequentially formed on the whole surface and etched by photolithography to pattern a data line 13L, a source electrode 13S and a drain electrodes 13D. As a result, a portion of the doped amorphous silicon layer 14' remains on the respective metal patterns (the data line 13L, the source electrode 13S and the drain electrodes 13D). The data line 13L must be formed at a designated distance from the pixel electrode 12 on the same layer to prevent a short circuit due to overlapping the pixel electrode 12.

Figure 2D:
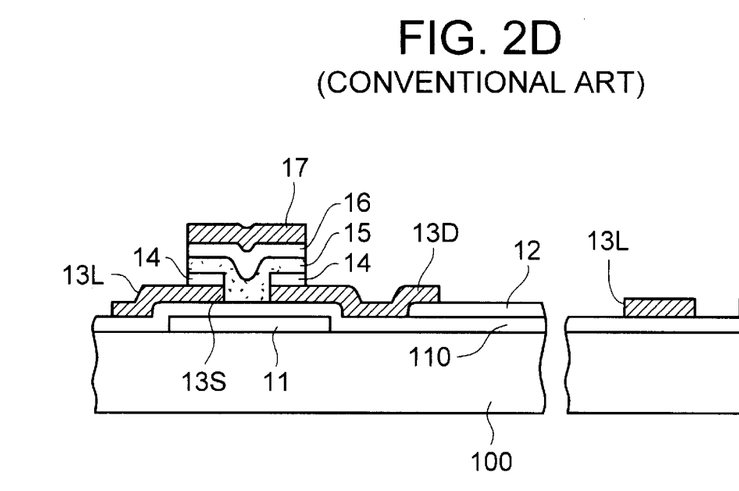

In FIG. 2D, an amorphous silicon layer, an insulating layer consisting of silicon oxide layer or silicon nitride, and a metal layer consisting of Cr or the like are sequentially formed on the whole surface, and etched by way of photolithography to form an active layer 15, a gate insulating layer 16 and a gate electrode 17. The remaining doped amorphous silicon layer 14' is simultaneously etched to form an ohmic contact layer 14 on the source and drain electrodes 13S and 13D that are in contact with the active layer 15.

As described above, a short circuit may occur in a conventional liquid crystal display because the pixel electrode lies on the same layer with the data line. To avoid the short circuit, the pixel electrode and data line must be spaced from each other by a designated distance, which reduces the area of the pixel electrode and thereby deteriorates the aperture ratio.

In the conventional art FIG. 2C and 2D, the doped amorphous silicon layer 14' lies on the top of the source and drain electrode 13S and 13D, and the pixel electrode 12 is exposed. When the layer 14' is etched by photolithography, the pixel electrode is damaged by etchant of etching the layer 14'.

SUMMARY OF THE INVENTION

Accordingly, the present invention has been made to solve the problem described above, and its object is to provide a liquid crystal display having high aperture ratio. This object is accomplished by laying an insulating material layer between the pixel electrode and data line, which permits the pixel electrode to partially overlap the data line.

To achieve these and other advantages and in accordance with the purposes of the present invention, as embodied and broadly described, a liquid crystal display is provided which comprises: an insulating substrate, an insulating layer covering the insulating layer, a pixel electrode formed on the insulating layer, an insulating interlayer covering the pixel electrode, said insulating interlayer having a contact hole therein, said contact hole exposing a part of the surface on the pixel electrode, a drain electrode formed on the insulating interlayer, said drain electrode connecting to the pixel electrode through the contact hole, a thin film transistor including the drain electrode, a source electrode and a channel structure on the insulating interlayer, and a data line extending to the source electrode and partially overlapping the pixel electrode.

According to another embodiment of the present invention, a liquid crystal display comprises: an insulating substrate, a pixel electrode formed on the insulating substrate, a pixel insulating layer covering the pixel electrode and the exposed portion of the insulating substrate, a gate electrode formed on the pixel insulating layer, a gate insulating layer covering the gate electrode and the exposed portion of the pixel insulating layer, a thin film transistor including a drain electrode, a source electrode, the gate electrode and a channel structure on the gate insulating layer; and a data line extending to the source electrode and overlapping the pixel electrode.

A method of fabricating a liquid crystal display according to the present invention comprises the steps of: forming a light shielding layer on an insulating substrate, forming a first insulating layer on the whole surface, forming a pixel electrode on the first insulating layer, forming a second insulating layer on the whole surface, forming a contact hole in the second insulating layer to expose a part of the pixel electrode, forming a source electrode, a data line and a drain electrode on the second insulating layer, said drain electrode connecting to the pixel electrode, and sequentially forming a channel structure, a third insulating layer and a metal layer on the whole surface and etching them to form an active layer, a gate insulating layer and a gate electrode.

A method of fabricating a liquid crystal display according to another embodiment of the present invention comprises the steps of: forming a pixel electrode on an insulating substrate, forming a first insulating layer on the whole surface, forming a gate electrode on the first insulating layer, forming a second insulating layer on the whole surface, forming a channel structure on the second insulating layer, forming a contact hole in the first and second insulating layers, said contact hole exposing a part of the pixel electrode, and forming a source electrode, a data line and a drain electrode, said data line partially overlapping the pixel electrode by a given area.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain but not limit the principles of the invention.

In the drawings.

DETAILED DESCRIPTION OF PREFERRED EMBODIMENT

Reference will now be made in detail to the preferred embodiments of the present invention examples of which are illustrated in the accompanying drawings.

Figure 3A:
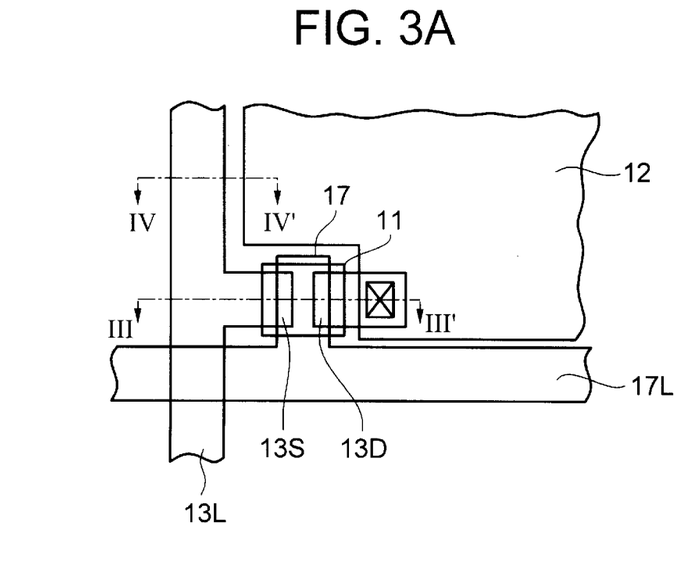
FIGS. 3A, 3B and 3C are plan and sectional views of a liquid crystal display having a top gate structure according to a first preferred embodiment of the present invention.
Figure 3B:
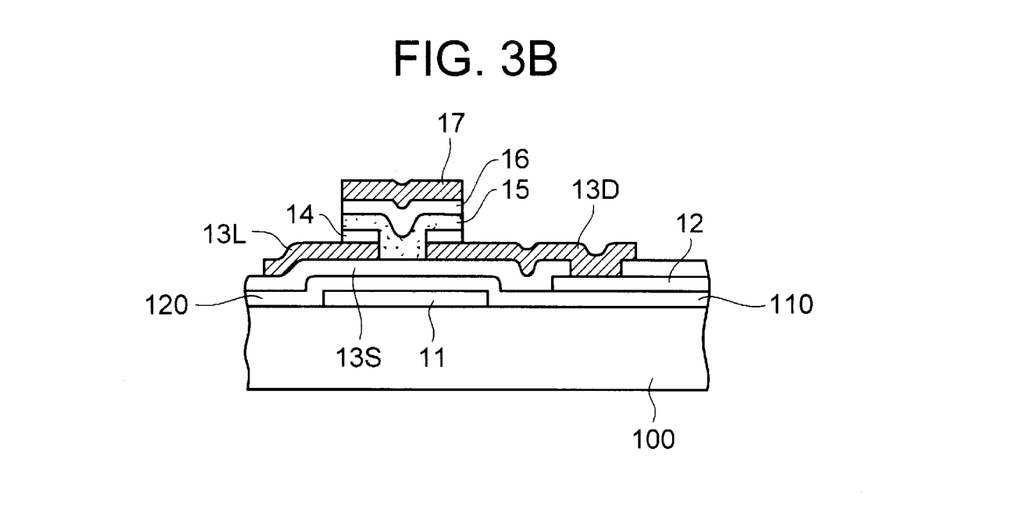
Figure 3C:
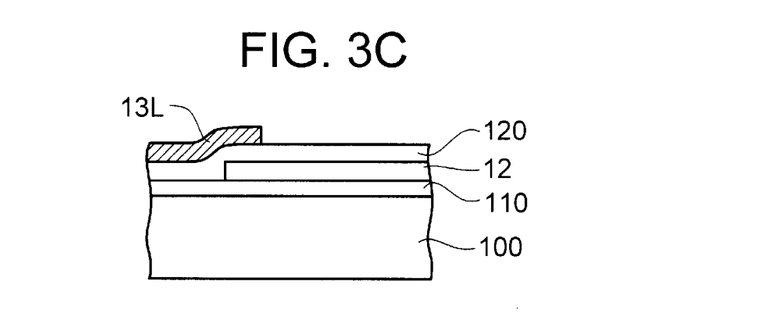

FIGS. 3A, 3B and 3C show a liquid crystal display having a top gate structure according to a first embodiment of the present invention. FIG. 3A is a plan view of the liquid crystal display, and FIGS. 3B and 3C are cross-sectional views respectively taken along the lines III-III' and IV-IV' in FIG. 3A.

Referring to FIG. 3A, a data line 13L intersects a gate line 17L on a substrate, preferably an insulating substrate. The data line 13L connects to a source electrode 13S. The source electrode 13S is on the opposite side of a drain electrode 13D, which is formed from the same material as the data line 13L. The gate line 17L connects to a gate electrode 17 properly overlapping the source and drain electrodes 13S and 13D and an active layer 15, thereby forming a switching device. The pixel electrode 12 connects to the drain electrode 13D and partially overlaps the data line 13L by a given area.

As shown in FIG. 3B, a light shielding layer 11 is formed on the insulating substrate 100 and an insulating layer 110 covers the light shielding layer 11. An insulating interlayer 120 covers the pixel electrode 12 formed on the insulating layer 110. The data line 13L, the source electrode 13S (which extends from the data line 13L), and the data electrode 13D are formed on the insulating interlayer 120. The drain electrode 13D is connected to the pixel electrode 12 through a contact hole formed in the insulating interlayer 120. On the source and drain electrodes 13S and 13D, an active layer 15, a gate insulating layer 16 and a gate electrode 17 are formed in the same pattern. A reference numeral 14 indicates an ohmic contact layer. The active layer 15 and the ohmic contact layer 14 represent a channel structure.

Referring to FIG. 3C, the insulating substrate 100 is covered with the insulating layer 110 on which the pixel electrode 12 is formed. The insulating interlayer 120 covers the pixel electrode 12. The data line 13L is formed to partially overlap the pixel electrode 12.

FIGS. 4A to 4D are sectional views taken along the lines III-III' (left side) and IV-IV' (right side) in FIG. 3A, illustrating a process for fabricating the liquid crystal display according to the first embodiment of the present invention.

Figure 4A:
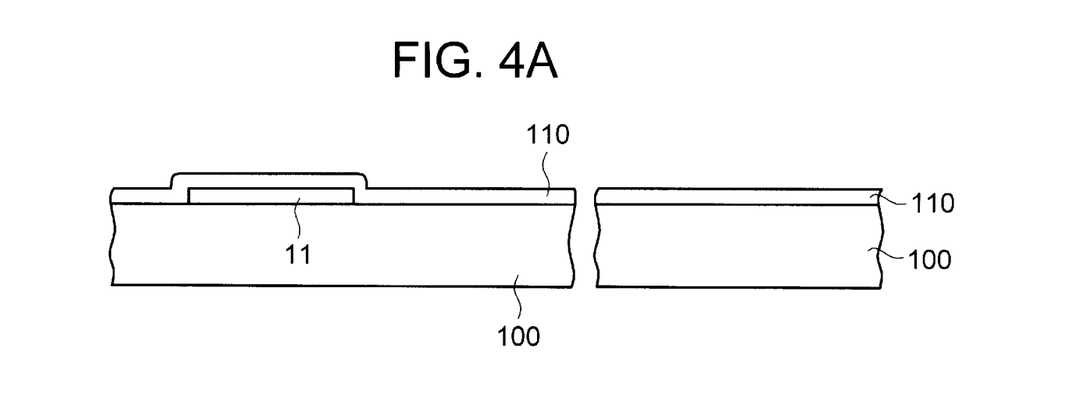
FIGS. 4A to 4D are sectional views taken along the lines III-III' and IV-IV' in FIG. 3A to illustrate a process for fabricating the novel liquid crystal display.

As shown in FIG. 4A, a metal layer, e.g., Cr or the like, is formed on the insulating substrate 100 and etched by photolithography to pattern a light shielding layer 11. The insulating layer 110 is formed on the whole surface, e.g., by depositing an insulating material such as silicon oxide.

Figure 4B:
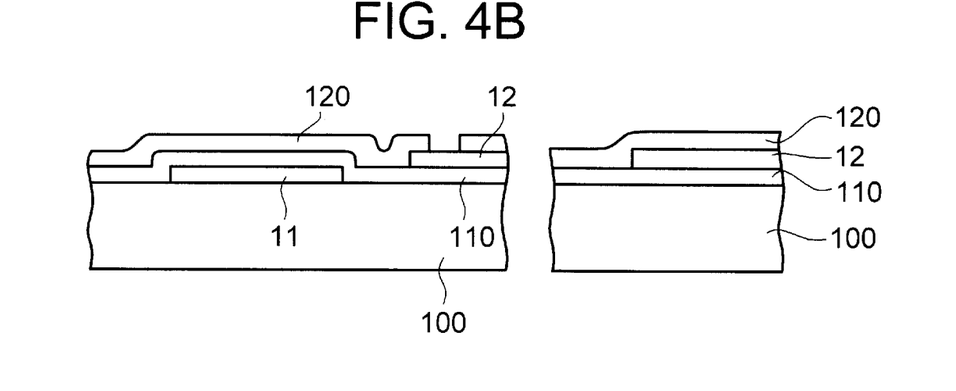

As shown in FIG. 4B, a transparent conductive layer is formed on the insulating layer 110 and etched by photolithography to pattern the pixel electrode 12. The insulating interlayer 120 is formed by depositing an insulating material, e.g., silicon oxide, and etched by photolithography to form the contact hole exposing a part of the pixel electrode 12.

Figure 4C:
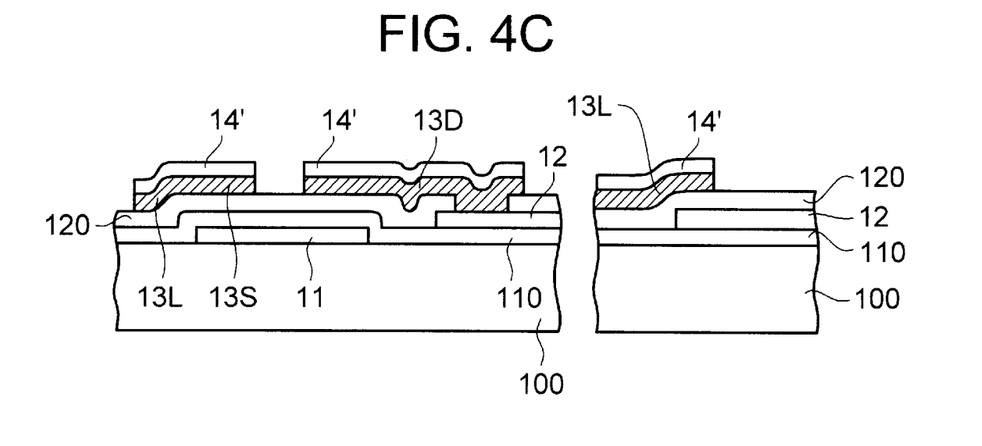

Referring to FIG. 4C, a metal layer, e.g., Al or the like, and a doped amorphous silicon layer 14' (which will act as an ohmic contact layer) are sequentially formed on the whole surface and etched by photolithography to pattern a data line 13L, a source electrode 13S and a drain electrode 13D. The drain electrode 13D is connected to the pixel electrode 12 through the contact hole formed in the insulating interlayer 120. As a result, a portion of the doped amorphous silicon layer 14' remains on the respective metal patterns.

Forming the insulating interlayer 120 between the pixel electrode 12 and the data line 13L makes it possible to partially overlap the pixel electrode 12 with the data line 13L without a short circuit. As a resulting advantage, the area of the pixel electrode can be increased in the initial stage of fabrication.

The parasitic capacitance due to overlapping the data line and pixel electrode is slight in the case that the insulating interlayer is formed from a material that has a low dielectric constant. It is therefore more desirable to form the insulating interlayer from, e.g., an organic insulating material having a low dielectric constant such as BCB (BenzoCycloButane) or SOG (Spin On Glass).

Figure 4D:
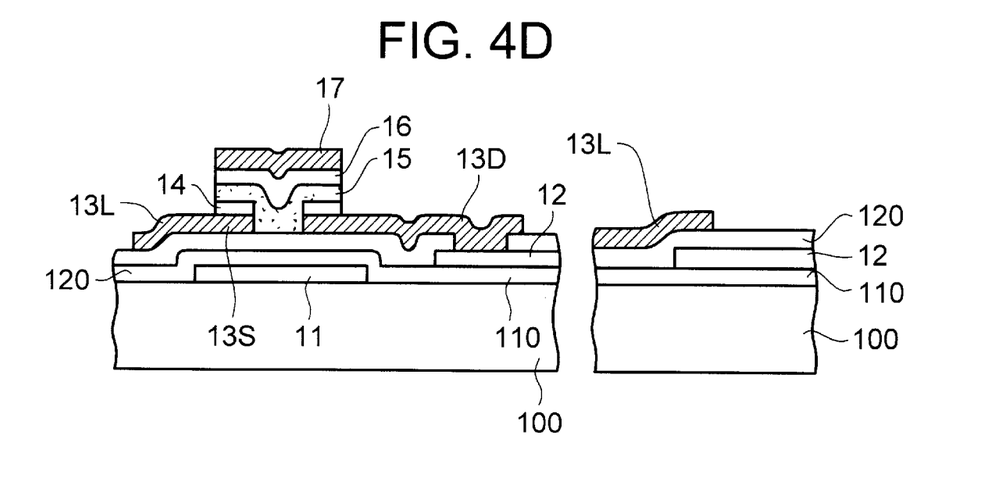

In FIG. 4D, an amorphous silicon layer, an insulating layer, e.g., of silicon oxide or silicon nitride, and a metal layer, e.g., of Cr or the like, are sequentially formed on the whole surface and etched by photolithography to pattern an active layer 15, a gate insulating layer 16 and a gate electrode 17. The remaining doped amorphous silicon layer 14' is also etched to form an ohmic contact layer 14 on the source and drain electrodes 13S and 13D that are in contact with the active layer 15. Again, the ohmic contact layer 14 and the active layer 15 define a channel structure.

According to the first embodiment as described above, it is possible to avoid a short circuit between the data line and pixel electrode because the pixel electrode and the data line are electrically isolated by the insulating interlayer 120. Therefore, the pixel electrode can be formed to overlap the data line. As a result, the aperture ratio is enhanced due to a larger area of the pixel electrode compared with the conventional art.

Figure 5A:
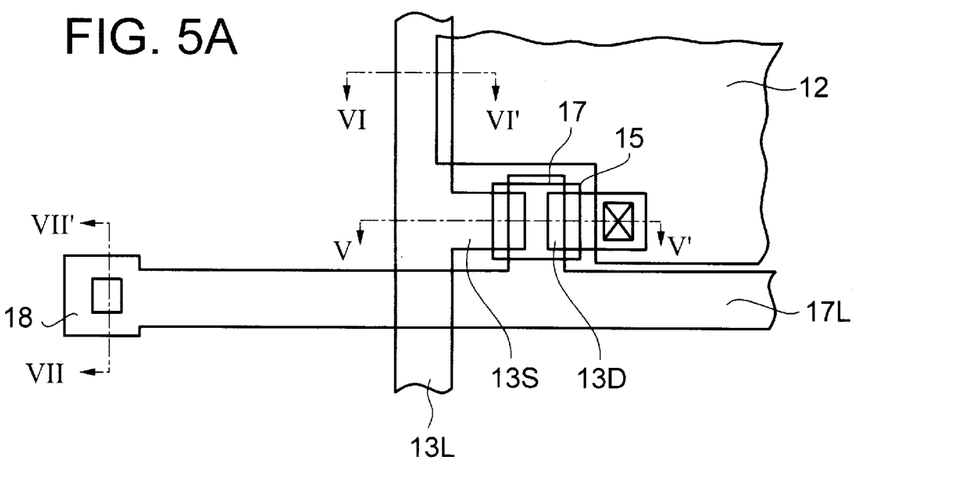
FIGS. 5A to 5D are plan and sectional view of a liquid crystal display having a bottom gate structure according to a second preferred embodiment of the present invention.
Figure 5B:
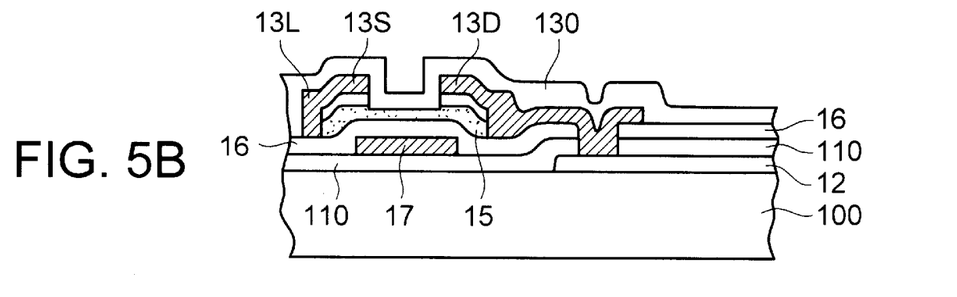
Figure 5C:
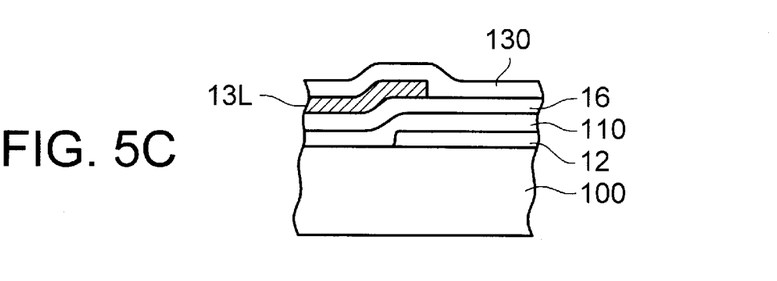
Figure 5D:
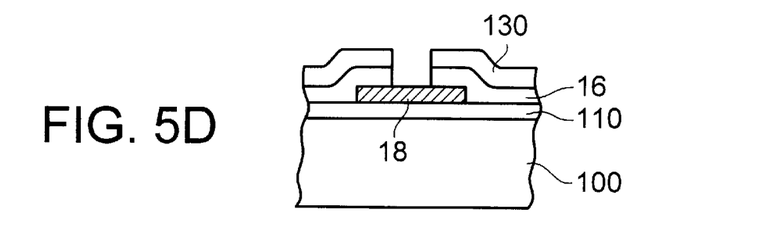

FIGS. 5A to 5D show a liquid crystal display having a bottom gate structure according to a second preferred embodiment of the present invention. FIG. 5A is a plan view of the liquid crystal display, and FIGS. 5B, 5C and 5D are cross-sectional views respectively taken along the lines V-V', VI-VI' and VII-VII' in FIG. 5A.

Referring to FIG. 5A, a data line 13L intersects a gate line 17L on a substrate, preferably an insulating substrate. The data line 13L connects to a source electrode 13S. The source electrode 13S is on the opposite side of a drain electrode 13D formed from the same wiring material with the data line 13L. One end of the gate line 17L is connected to a gate pad (only the gate pad is shown in the drawing, but one end of the data line 13L is also connected to a data line pad). A gate electrode 17 is connected to the gate line 17L and overlaps the source and drain electrodes 13S and 13D and an active layer 15, thereby forming a switching device. The pixel electrode 12 is connected to the drain electrode 13D, and is partially overlapped by the data line 13L.

As shown in FIG. 5B, the pixel electrode 12 is formed on the insulating substrate 100 and a pixel insulating layer 110 covers the pixel electrode 12. A gate insulating layer 16 covers the gate electrode 17 formed on the insulating layer 110. The active layer 15 is formed on the gate insulating layer 16. On the active layer 15, source and drain electrodes 13S and 13D are formed. The drain electrode is connected to a part of the pixel electrode 12 through a contact hole formed commonly in the insulating layer 110 and gate insulating layer 16. A protective layer 130 covers the whole surface.

Referring to FIG. 5C, the pixel electrode 12 is formed on the insulating substrate 100. The insulating layer 110 and the gate insulating layer 16 cover the pixel electrode 12. The data line 13L overlaps the pixel electrode 12 by a predetermined area on the gate insulating layer 15. The protective layer 130 covers the whole surface.

As shown in FIG. 5D, the insulating layer 110 is formed on the insulating substrate 100. The gate pad is formed on the insulating layer 110. The gate insulating layer 16 and the protective layer 130 cover the gate pad 18. The insulating layer 16 and protective layer 130 have a common contact hole to expose a part of the surface on the gate pad 18.

FIG. 6A to 6F are sectional views taken along the lines V-V' (left side), VI-VI' (center) and VII-VII' (right side) in FIG. 5A, illustrating a process for fabricating the liquid crystal display according to the second embodiment of the present invention.

Figures 6A, 6B:
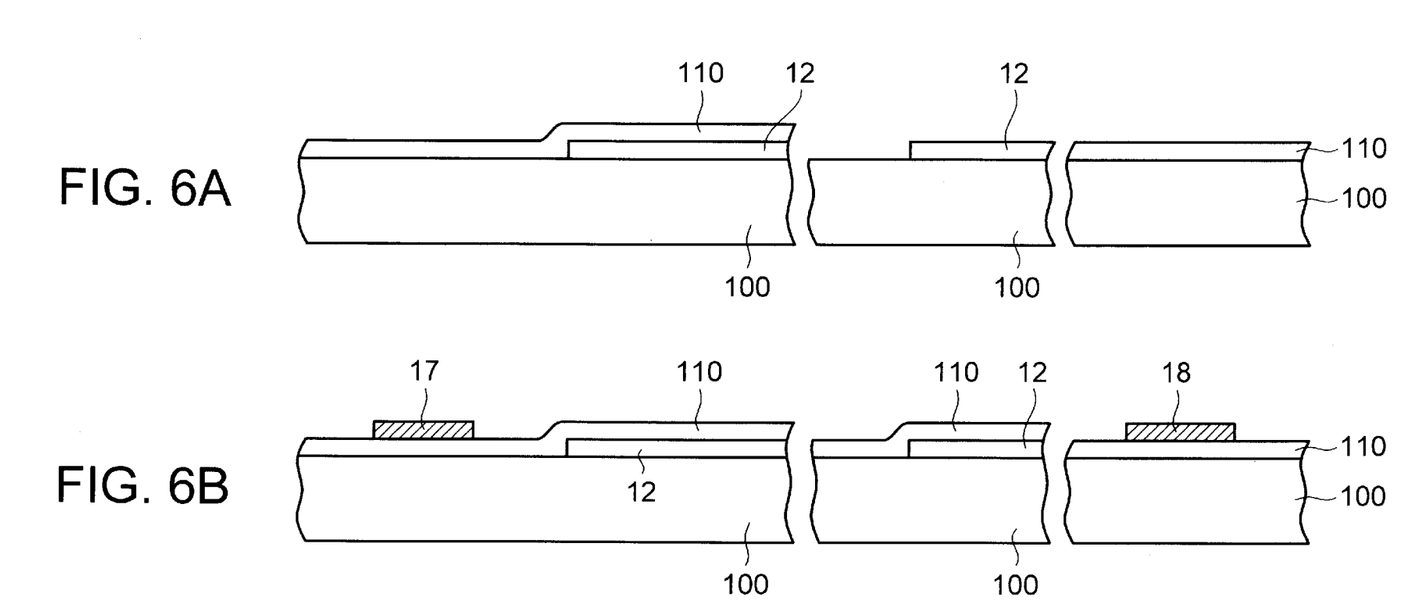
FIGS. 6A to 6F are sectional views taken along the line V-V', VI-VI' and VII-VII' in FIG. 5A to illustrate a process for fabricating the novel liquid crystal display.

As shown in FIG. 6A, a transparent conductive layer is formed on the insulating substrate 100 and etched by photolithography to pattern the pixel electrode 12. The insulating layer is formed, e.g., by depositing an insulating material such as silicon oxide on the whole surface.

As shown in FIG. 6B, a metal layer, e.g., Cr or the like, is formed on the insulating layer 110 and etched by photolithography to pattern a gate electrode 17, a gate line and a gate pad 18 connected to the gate line.

Figure 6C:
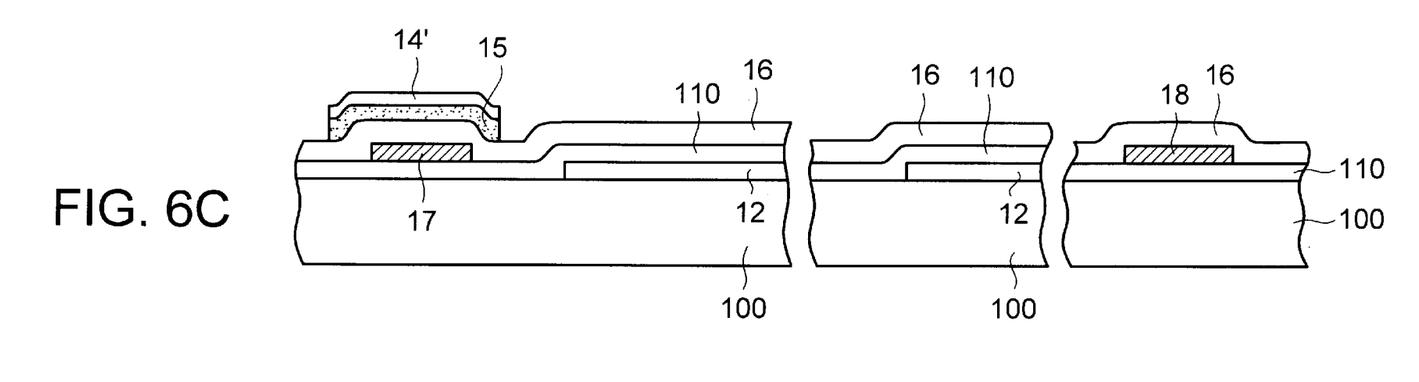

Referring to FIG. 6C, a gate insulating layer 16 is formed, e.g., by depositing insulating material such as silicon oxide or silicon nitride. An amorphous silicon layer 14' and a doped amorphous silicon layer, which define a channel structure, are formed on the gate insulating layer 16 and etched by photolithography to pattern an active layer 15. As a result of patterning, a portion of the doped amorphous silicon layer remains the active layer 15.

Figure 6D:
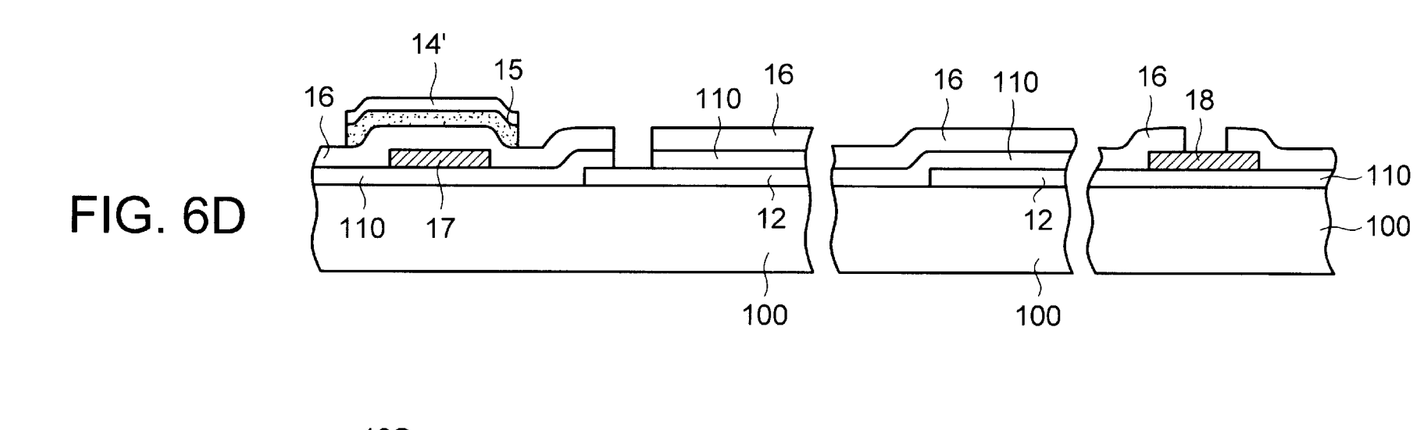

Referring to FIG. 6D, a contact hole is formed in the insulating layer 110 and gate insulating layer 16 on the pixel electrode 12, exposing a part of the surface on the pixel electrode 12. Another contact hole exposing a part of the surface on the gate pad 18 is simultaneously formed in the gate insulating layer 16.

Figure 6E:
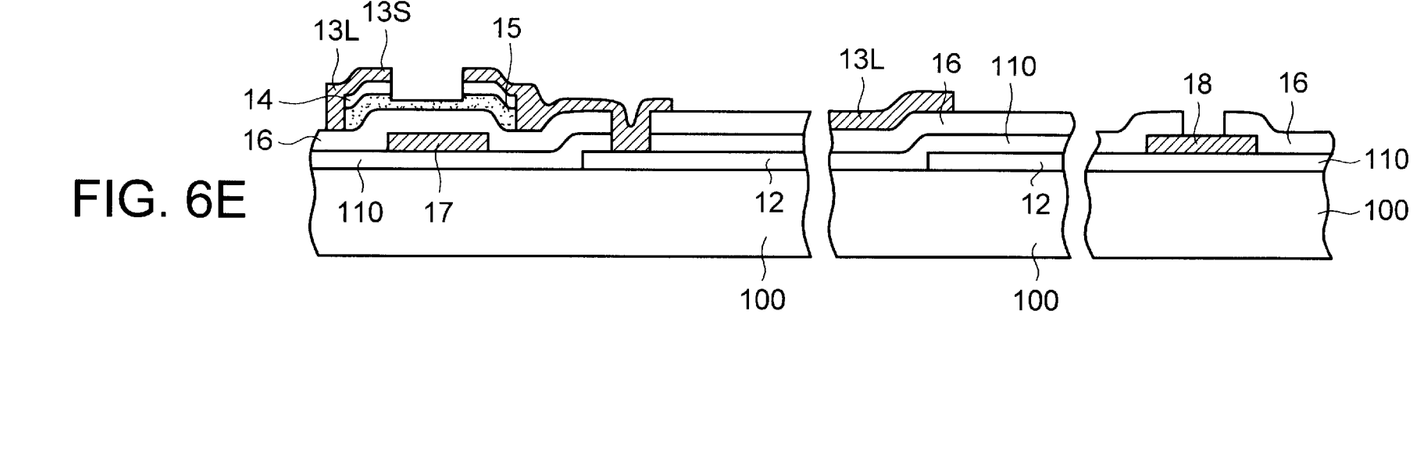

As shown in FIG. 6E, a metal layer, e.g., Cr or the like is formed on the whole surface and etched by photolithography to pattern a source electrode 13S, a data line 13L and a drain electrode 13D connected to the pixel electrode 12.

Forming the insulating layer 110 and gate insulating layer 16 between the pixel electrode 12 and the data line 13L makes it possible to overlap the pixel electrode 12 with the data line 13L without a short circuit. As a resulting advantage, the area of the pixel electrode can be increased in the initial stage of fabrication.

Similarly to the first embodiment, the insulating layer and the insulating interlayer are preferably formed from an organic insulating material of low dielectric constant such as BCB (BenzoCycloButane) or SOG (Spin On Glass) in order to decrease the effect of the parasitic capacitance between the data line and pixel electrode.

Then, the remaining doped amorphous silicon layer 14' is etched by photolithography using the source and drain electrodes 13S and 13D as a mask to form an ohmic contact layer 14.

Figure 6F:
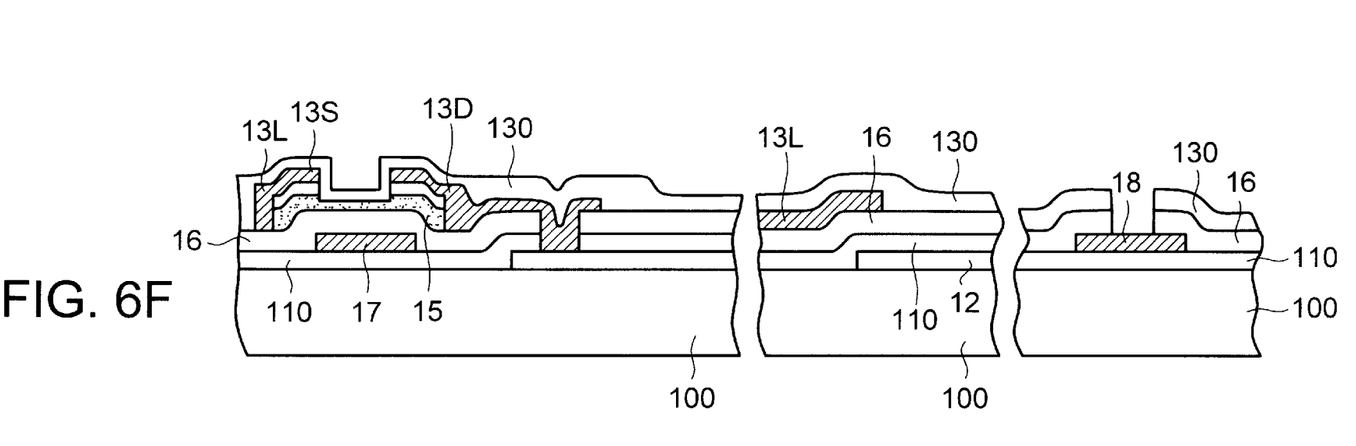

As shown in FIG. 6F, a protective layer 130 is formed by depositing an insulating material such as silicon oxide or silicon nitride on the whole surface. The protective layer 130 is etched to pattern a contact hole exposing a portion of the surface of the gate pad 18.

According to the second embodiment of the present invention, it is possible to avoid a short circuit between the data line and pixel electrode since the pixel electrode and the data line are electrically isolated by the insulating layer and gate insulating layer. Therefore, the pixel electrode can be formed to overlap the data line. As a result, the aperture ratio can be enhanced due to a larger area of the pixel electrode as compared with the conventional art. The pixel electrode is not damaged by etching the doped amorphous silicon layer after the pixel electrode is covered by the drain electrode.

It will be apparent to those skilled in the art that various modifications and variations can be made in the liquid crystal display of the present invention without departing from the spirit or scope of the invention. Thus, it is intended that the present invention cover the modifications and variations of this invention provided they come within the scope of the appended claims and their equivalents.

What is claimed is:

1. A liquid crystal display comprising:
   a substrate;
   a first insulating layer on said substrate;
   a pixel electrode formed on said first insulating layer;
   a second insulating layer on said pixel electrode and on the first insulating layer;
   said second insulating layer having a contact hole formed therein, said contact hole exposing a part of a surface of said pixel electrode;
   a drain electrode formed on said second insulating layer, said drain electrode connecting to said pixel electrode through said contact hole,
   a thin film transistor, including said drain electrode, a source electrode and a channel structure, on said second insulating layer; and
   a data line connected to said source electrode and partially overlapping said pixel electrode.

2. The liquid crystal display as claimed in claim 1, further including a light shielding layer formed between said substrate and said first insulating layer and located under said thin film transistor.

3. The liquid crystal display as claimed in claim 1, wherein said substrate is an insulating substrate.

4. The liquid crystal display as claimed in claim 1, wherein said second insulating layer includes an organic insulating material.

5. The liquid crystal display as claimed in claim 4, wherein said organic insulating material is one of BCB (BenzoCycloButane) and SOG (Spin On Glass).

6. The liquid crystal display as claimed in claim 1, wherein the channel structure includes an active layer between said source electrode and drain electrode and an ohmic contact layer partially between said active layer and said source and drain electrodes respectively.

7. A method of fabricating a liquid crystal display, the method comprising the steps of:
   providing a substrate;
   forming a light shielding layer on a selected area of said substrate;
   forming a first insulating layer on said substrate and on said light shielding layer;
   forming a pixel electrode on said first insulating layer;
   forming a second insulating layer on said pixel electrode and said first insulating layer;
   forming a contact hole in said second insulating layer to expose a part of said pixel electrode;
   forming a source electrode, a data line and a drain electrode on said second insulating layer, said drain electrode connecting to said pixel electrode through said contact hole; and
   forming a thin film transistor, over said light shielding layer, that includes said source electrode and said data electrode.

8. The method as claimed in claim 7, wherein said step of forming said source electrode, said data line and said drain electrode includes forming said data line to partially overlap said pixel electrode.

9. The method as claimed in claim 7, wherein said step of forming said thin film transistor includes:
   sequentially forming and then etching an amorphous silicon layer, a third insulating layer and a metal layer on the exposed surface to form an active layer, a gate insulating layer and a gate electrode.

10. The method as claimed in claim 7, wherein said second insulating layer is one of BCB (BenzoCycloButane) and SOG (Spin On Glass).

11. The method as claimed in claim 7, wherein said substrate is an insulating substrate.

* * * * *